United States Patent
Ohta et al.

(10) Patent No.: US 10,816,332 B2
(45) Date of Patent: Oct. 27, 2020

(54) PATTERN MEASUREMENT DEVICE AND PATTERN MEASUREMENT METHOD

(71) Applicant: Hitachi High-Tech Corporation, Minato-ku, Tokyo (JP)

(72) Inventors: Hiroya Ohta, Tokyo (JP); Kenji Tanimoto, Tokyo (JP); Tomohiro Tamori, Tokyo (JP); Takuma Yamamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 182 days.

(21) Appl. No.: 16/086,063

(22) PCT Filed: Apr. 13, 2016

(86) PCT No.: PCT/JP2016/061853
§ 371 (c)(1),
(2) Date: Sep. 18, 2018

(87) PCT Pub. No.: WO2017/179138
PCT Pub. Date: Oct. 19, 2017

(65) Prior Publication Data
US 2020/0292308 A1    Sep. 17, 2020

(51) Int. Cl.
*G01B 15/00* (2006.01)
*H01J 37/244* (2006.01)
(Continued)

(52) U.S. Cl.
CPC .......... *G01B 15/00* (2013.01); *H01J 37/1472* (2013.01); *H01J 37/20* (2013.01); *H01J 37/244* (2013.01)

(58) Field of Classification Search
CPC ...... G01B 15/00; H01J 37/1472; H01J 37/20; H01J 37/244
See application file for complete search history.

(56) References Cited

U.S. PATENT DOCUMENTS 5,161,201 A    11/1992   Kaga et al.
6,452,175 B1    9/2002   Adamec
(Continued)

FOREIGN PATENT DOCUMENTS

JP          3-233309 A      10/1991
JP          2001-82931 A     3/2001
(Continued)

OTHER PUBLICATIONS

International Search Report (PCT/ISA/210) issued in PCT Application No. PCT/JP2016/061853 dated Jul. 12, 2016 with English translation (four (4) pages).
(Continued)

*Primary Examiner* — Nicole M Ippolito
*Assistant Examiner* — Hanway Chang
(74) *Attorney, Agent, or Firm* — Crowell & Moring LLP

(57) ABSTRACT

The purpose of the present invention is to provide a pattern measurement device that is capable of highly accurately measuring a groove bottom, hole bottom, or the like, regardless of the accuracy of the formation of a deep groove or deep hole. To that end, the present invention proposes a pattern measurement device provided with a computation device for measuring the dimensions of a pattern formed on a sample on the basis of a signal obtained by a charged particle beam device, wherein the computation device determines the deviation between a first part of the pattern and a second part of the pattern at a different height than the first part and pattern dimension values on the basis of a detection signal obtained on the basis of the scanning of the sample by a charged particle beam and corrects the pattern dimension values using the deviation determined from the detection signal and relationship information indicating the relationship between the pattern dimensions and the deviation.

11 Claims, 10 Drawing Sheets

(51) Int. Cl.
*H01J 37/20* (2006.01)
*H01J 37/147* (2006.01)

(56) References Cited

U.S. PATENT DOCUMENTS

| | | |
|---|---|---|
| 7,164,128 B2 | 1/2007 | Miyamoto et al. |
| 9,046,475 B2 | 6/2015 | Langer et al. |
| 9,224,575 B2 | 12/2015 | Yamamoto et al. |
| 2004/0207415 A1 | 10/2004 | Yamada et al. |
| 2009/0084954 A1 | 4/2009 | Ezumi et al. |
| 2014/0014836 A1 | 1/2014 | Isawa et al. |
| 2016/0379798 A1 | 12/2016 | Shishido et al. |

FOREIGN PATENT DOCUMENTS

| | | |
|---|---|---|
| JP | 2002-83849 A | 3/2002 |
| JP | 2003-157790 A | 5/2003 |
| JP | 2005-181058 A | 7/2005 |
| JP | 2009-99540 A | 5/2009 |
| JP | 4500653 B2 | 7/2010 |
| JP | 4689002 B2 | 5/2011 |
| JP | 2014-22040 A | 2/2014 |
| JP | 2014-86393 A | 5/2014 |
| JP | 5722719 B2 | 5/2015 |
| JP | 2015-106530 A | 6/2015 |

OTHER PUBLICATIONS

Japanese-language Written Opinion (PCT/ISA/237) issued in PCT Application No. PCT/JP2016/061853 dated Jul. 12, 2016 (three (3) pages).

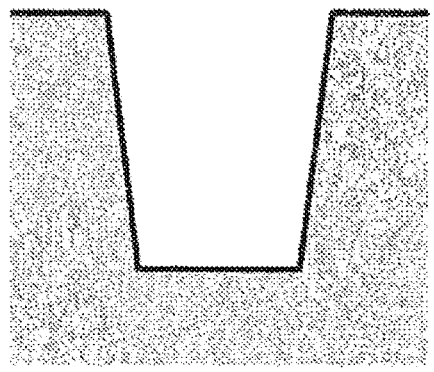
FIG. 2A
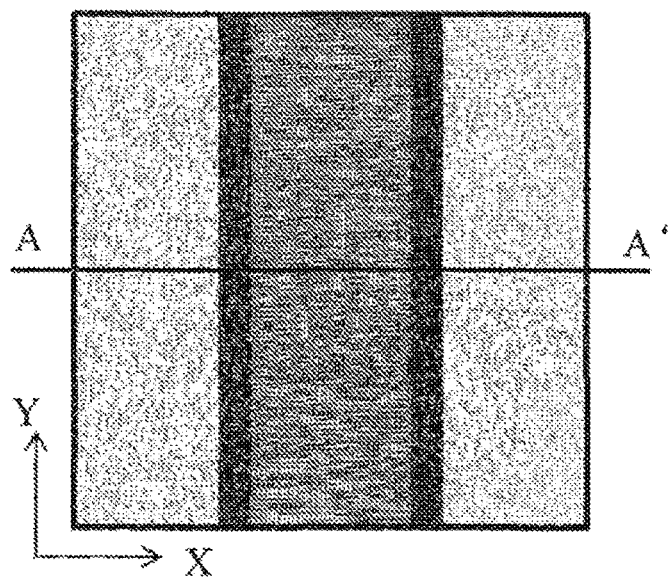
FIG. 2B
FIG. 2C
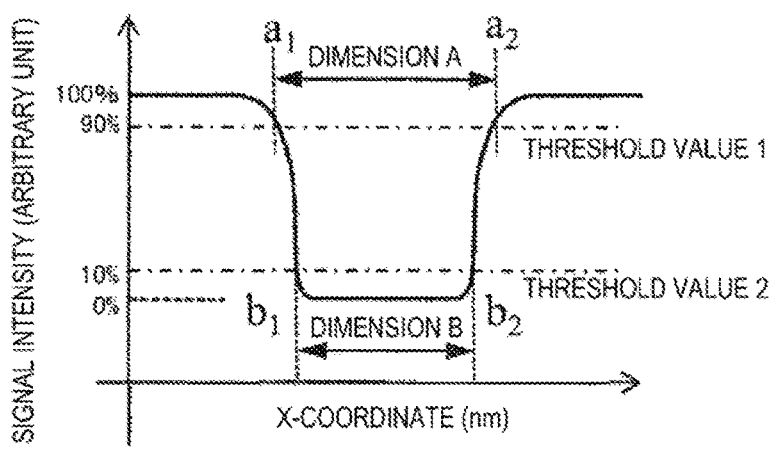
FIG. 2D
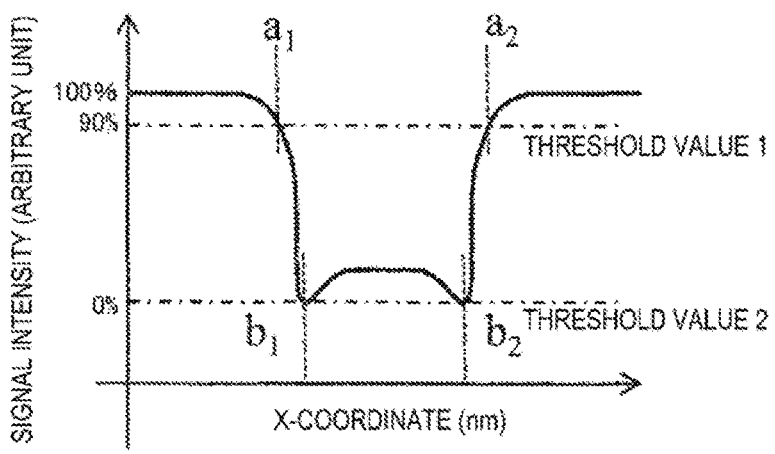

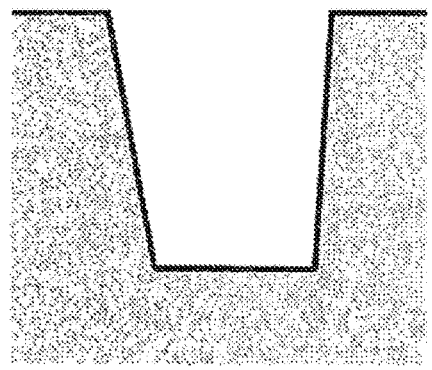
FIG. 3A
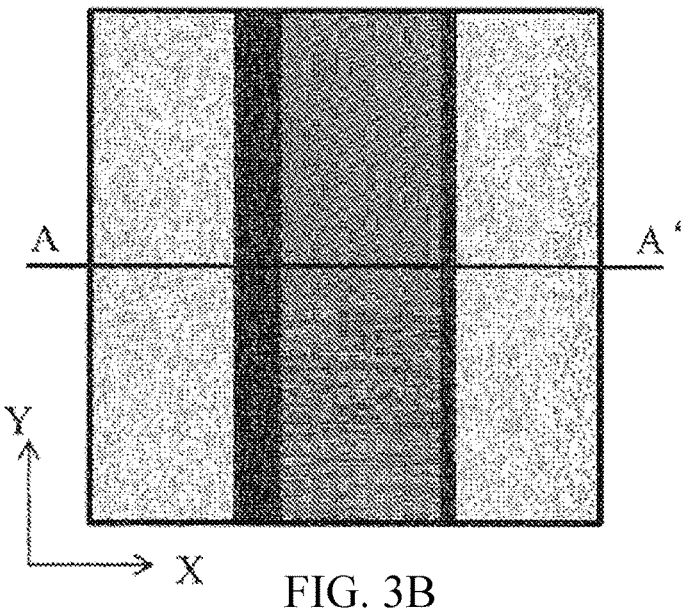
FIG. 3B
FIG. 3C
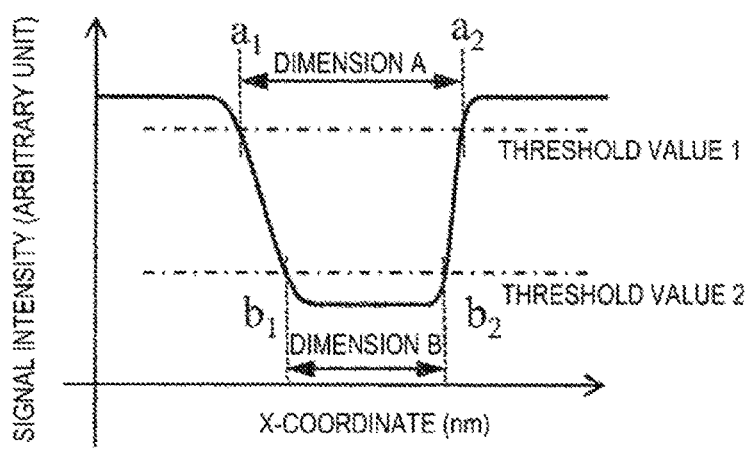
FIG. 3D
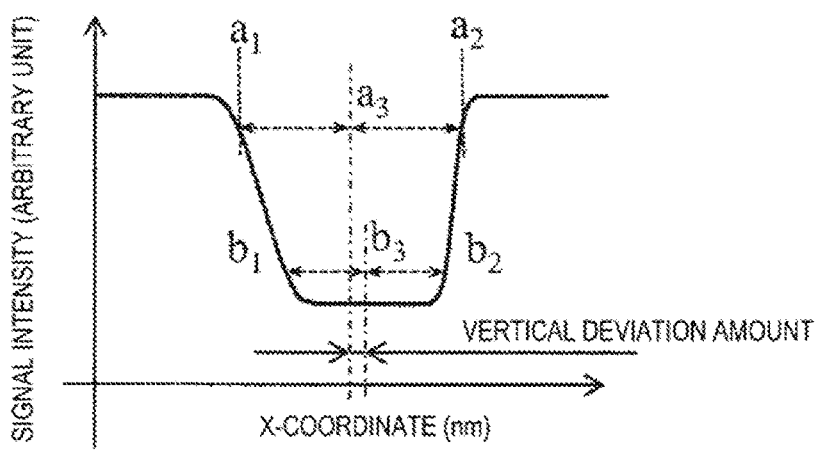

PATTERN MEASUREMENT DEVICE AND PATTERN MEASUREMENT METHOD

TECHNICAL FIELD

The present invention relates to a device and a method for measuring a pattern formed on a semiconductor device, and particularly, to a device and a method for measuring a pattern having a large aspect ratio such as a deep hole, a deep groove, and the like.

BACKGROUND ART

In the manufacture of a semiconductor device, recently, the progress of miniaturization has slowed, and integration relying on the miniaturization has become difficult. Meanwhile, there exists a high demand for high integration, and three-dimensionalization of a structure has been in progress as a substitute for the miniaturization. Further, due to the three-dimensionalization of the device, an overlapping error between different layers and dimensions of a deep groove and a deep hole have become important evaluation items. For example, in the case of a laminated device such as a so-called 3D-NAND, the number of layers increases due to a high integration, such that the laminated device is in a direction of becoming thicker as a whole device.

Meanwhile, a scanning electron microscope has been known as a device for measuring the semiconductor device which is in process of becoming miniaturized and is formed three-dimensionally. However, in measurement of the deep groove and the deep hole, escape of signal electrons from a pattern bottom part is rare, so that accuracy tends to be lower in comparison with that of surface measurement. Therefore, a measurement method for measuring superposition using electrons having energy that penetrates an upper layer and a lower layer (PTL 1 and PTL 2) is known. Further, an electron beam measurement device is also used for measuring a depth of a deep groove hole (PTL 3).

Etching is used for forming the deep hole and the deep groove, and control of etching is important to correctly form a shape. The deep groove and the deep hole include a pattern in which a depth ratio (aspect ratio) with respect to a dimension of an opening is equal to or more than 10. In the etching of the groove hole, a high level of in-plane uniformity of a wafer in vertical processing is required. Measuring an in-plane distribution and giving a measurement result to an etching device are key factors to improve a yield rate. Particularly, in the case of a pattern in which film is thick and thus consequently has a high aspect ratio, process uniformity tends to deteriorate at an outer peripheral part of the wafer, such that the pattern may be slanted.

Not limited to semiconductor patterns, when observing and measuring a three-dimensional shape using the scanning electron microscope, it has been known that a cross section shapes such as height of a pattern, angle of a side wall, and the like, or a three-dimensional reconstructing beam tilt can be measured by tilting a sample table or an electron beam, changing an incidence angle on the sample, and using the so-called stereo observation with a plurality of images that are not irradiated from an upper surface (PTL 4). It is a problem that the accuracy setting of the sample and the beam has a significant influence on the obtained cross-sectional shape and the accuracy of the reconstructed three-dimensional shape. To solve the problem, angle correction has been performed with high accuracy (PTL 5).

CITATION LIST

Patent Literature

PTL 1: JP Patent No. 5722719 (U.S. Pat. No. 9,046,475)
PTL 2: JP-A-2014-86393 (U.S. Pat. No. 9,224,575)
PTL 3: JP-A-2015-106530
PTL 4: JP Patent No. 4689002 (U.S. Pat. No. 6,452,175)
PTL 5: JP Patent No. 4500653 (U.S. Pat. No. 7,164,128)

SUMMARY OF INVENTION

Technical Problem

When the aspect ratio of the deep hole and the deep groove becomes large, the detection efficiency of electrons emitted from the bottom parts of the deep hole and the deep groove deteriorates. Further, according to examinations of inventors, as well as the deterioration of the detection efficiency, a different factor which lowers measurement accuracy caused by a high aspect ratio became clear. It is desirable that centers of upper parts and bottom parts of the deep hole and the deep groove patterns are coincident with each other when viewed from a perpendicular direction of a sample surface, but it is difficult to perform appropriate processing as the aspect ratio is large. Accordingly, the inventors have newly found out that a positional deviation between the upper part and the bottom part has an influence on the measurement accuracy of the bottom part, and also that the influence has a certain tendency. In patent literatures 1 to 5, described are various methods for performing observance and measurement of samples having three-dimensional structure. Meanwhile, a method for solving the deterioration of the measurement accuracy caused by the deviation between the upper part and the bottom part of the pattern is not described at all.

Hereinafter, proposed are a pattern measurement device and a pattern measurement method for measuring a groove bottom, a hole bottom, and the like with high accuracy regardless of the formation accuracy of a deep groove and a deep hole.

Solution to Problem

As one aspect of achieving the above-mentioned purpose, proposed is a pattern measurement device and a pattern measurement method, that is a pattern measurement device including a computation device for measuring a dimension of a pattern formed on a sample based on a signal obtained by a charged particle beam device, wherein the computation device obtains a deviation between a first part of the pattern and a second part of the pattern having a different height from the first part and a dimension value of the pattern from a detection signal obtained based on scanning of a charged particle beam on the sample, and corrects the dimension value of the pattern using the deviation obtained from the detection signal and relationship information indicating a relationship between the dimension of the pattern and the deviation.

Advantageous Effects of Invention

According to the above-mentioned configuration, it is possible to measure a groove bottom, a hole bottom, and the like with high accuracy regardless of the formation accuracy of a deep groove, a deep hole.

BRIEF DESCRIPTION OF DRAWINGS

FIGS. 2A to 2D are diagrams illustrating a cross-sectional diagram, an image, and a signal waveform of a groove-shaped pattern.

FIGS. 3A to 3D are diagrams illustrating a cross-sectional diagram, an image, and a signal waveform of a tilted groove-shaped pattern.

DESCRIPTION OF EMBODIMENTS

Figure 1:
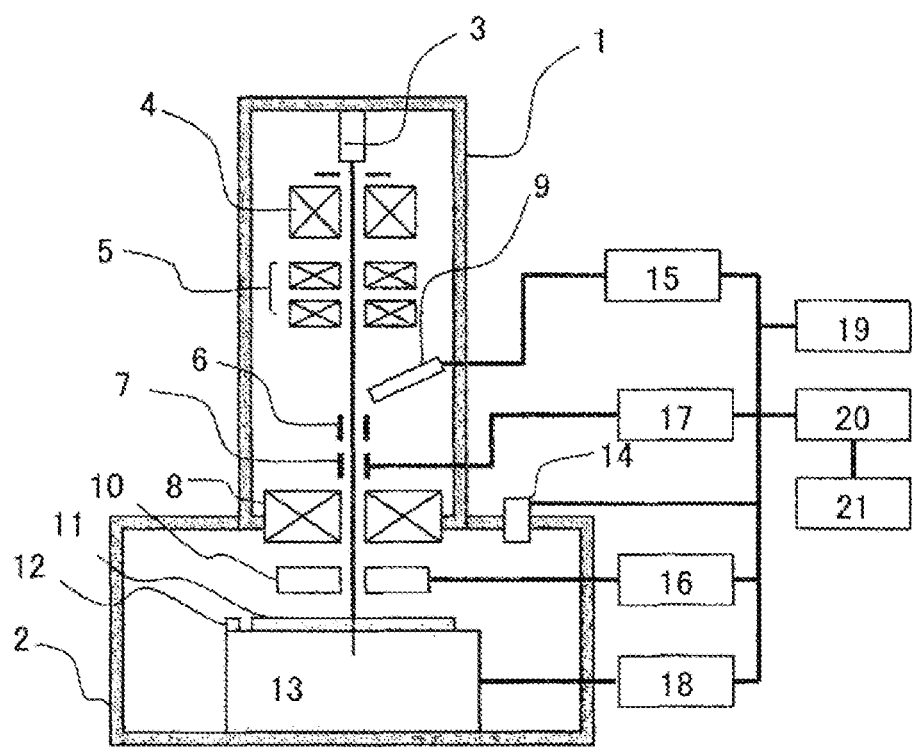
FIG. 1 is a diagram illustrating an outline of a pattern measurement device including a scanning electron microscope.

Hereinafter, examples will mainly describe a pattern measurement device using an electron beam for accurately measuring a dimension of a bottom part of a deep groove hole and a pattern tilt. Measuring the pattern tilt or the dimension of the bottom part of so-called deep groove and deep hole having a high aspect ratio with high accuracy becomes an important factor to determine an acquisition rate of a good-quality product by a semiconductor device. The pattern measurement device, to which a so-called scanning type electron microscope is applied, irradiates an electron beam having energy on a sample, and detects a secondary electron and a backscattered electron generated by a scattering phenomenon based on interaction between an electron which entered the sample and a substance. A scattering in a solid has certain expansion depending on energy of the entering electron. Further, in the scattering in the solid, since it is difficult to distinguish electrons generated from side walls and bottoms of a groove and a hole, and the generated electrons disappear when colliding against side walls or pass through the side walls and then are emitted from the sample surface, a signal amount is significantly reduced in comparison with a flat sample, thereby becoming an image and a signal intensity waveform having a low signal noise ratio.

Further, when the pattern has a tilt, a complex movement occurs due to local penetration and scattering at the side walls, thereby measuring a tilt angle or the dimension of the bottom part of the pattern with insufficient accuracy.

The examples described hereinafter relate to a pattern measurement device and a pattern measurement method capable of highly accurately measuring a dimension of a hole or a groove having high aspect ratio.

In the examples described hereinafter, for example, described is a pattern measurement device as an adopted example that is capable of converting a dimension value, including: a primary electron beam irradiation means for scanning and irradiating a primary electron beam on a pattern formed on a substrate; more than two electron detection means for detecting electrons emitted from the substrate on which the primary electron beam is irradiated; an image forming means for forming more than two electron beam images according to signal intensities of the electrons detected by the respective electron detection means; a means for selecting an electron beam image from one or two detectors and calculating two or more dimensions; a means for calculating center positions of two or more images; and a conversion means for converting a dimension value from a predetermined parameter. Further, one or more detectors may be provided, and respective information of deep parts such as a deep hole, and the like (first part) and a relatively shallow part (second part) may be appropriately acquired.

Further, the parameter is generated based on a measurement value obtained by irradiating the electron beams at a plurality of incident angles, and functionalizes or tabulates a change in a vertical deviation and a bottom part dimension of the pattern. The parameter can be automatically extracted by storing an operation program that executes a measurement process for generating relationship information such as a function and a table in a predetermined storage medium. Further, it is possible to include a computation device that prepares an evaluation sample for evaluating a beam tilt angle, corrects an irradiation angle of the beam using the evaluation sample, and calculates a tilt angle of the pattern by a difference between a tilt angle of the primary electron beam and an image center position.

According to the above-mentioned configuration, it is possible to measure the pattern tilt generated in a manufacturing process of the semiconductor device and a dimension of a pattern bottom part with high accuracy.

Hereinafter, a pattern measurement device capable of measuring a bottom part, and the like of a pattern with high accuracy will now be described based on the drawings. Further, examples of the present invention are not limited to the examples which will be described later, and can be modified to various forms within the scope of the technical ideas thereof.

Example 1

FIG. 1 illustrates one example of a charged particle beam device used in Example 1. In Example 1, a scanning electron microscope (SEM), which is one embodiment of the charged particle beam device, will be described as an example. Meanwhile, another charged particle beam device such as an ion beam device for generating a signal waveform or an image based on scanning of an ion beam, and the like may be used as a signal waveform acquisition device of the pattern measurement device. A main body of the scanning electron microscope is constituted of an electron optical column 1 and a sample chamber 2.

Inside the column 1, provided are an electron gun 3 which is an emission source of a primary electron beam (hereinafter referred to as an electron beam) which generates electrons and is given energy at a specific acceleration voltage; a condenser lens 4 for focusing the electron beam; a deflector 7 for scanning the electron beam on a sample (wafer 11); and an objective lens 8 for focusing the electron beam and irradiating the focused electron beam on the sample. Further, inside the column 1, provided is a deflector 5 which makes the electron beam a tilt beam by separating the electron beam from an ideal optical axis and deflecting the separated electron beam in a direction of being tilted to the ideal optical axis. The secondary electron, and the like emitted from the wafer 11 are deflected in direction of a detector 9 by an E×B deflector (orthogonal electromagnetic field generator) 6. A negative voltage is applied to the wafer 11 from a negative voltage application power source which is not shown in the drawing, and the secondary electron emitted from the wafer 11 is accelerated in a direction of the electron gun 3 by an electric field formed between the wafer 11 and the objective lens 8. A detector 10 for mainly detecting a backscattered electron is disposed between the wafer 11 and the objective lens 8.

The electron beam is scanned by the deflector 7 which is driven by a signal given from an electron beam scanning controller 17. The scanning is performed, for example, in such a manner that one line is scanned in an X direction, after which a position is deviated by one line (normally equivalent to a pixel) in a Y direction and the next line is scanned. The above-mentioned process is repeated to perform the scanning on a surface shape. An image is formed by synchronizing a scanning signal with a signal outputted from an electronic detector which will be described later. An XY stage 13 installed in the sample chamber 2 moves the wafer 11 according to a signal given from a stage controller 18. A standard sample 12 used for correcting the electron beam is mounted on the XY stage 13. Further, provided is an optical microscope 14 for detecting a position and rotation and performing alignment when the wafer, which is a sample on the XY stage, is introduced and mounted (wafer loading) thereon.

Detection signals outputted from the electronic detector 9 and the electronic detector 10 are signal-converted by amplifiers 15 and 16 and inputted to an image processing device 19. The image processing device 19 performs signal conversion by addition or a predetermined method, thereby imaging the detection signals. In the example, the detector 9 mainly detects the secondary electron, and the detection signal mainly indicates pattern information of a wafer surface (an upper layer). Further, the electronic detector 10 mainly detects the backscattered electron, and the detection signal mainly indicates information of a lower layer of the pattern. In order to detect the signals of the upper and lower sides of the pattern, for example, an electron beam having high acceleration which can reach the pattern of the lower layer may be irradiated on the wafer 11. Further, when measuring the bottom part of the deep groove, the detection signal for performing hole bottom measurement may be acquired by scanning the electron beam for measurement after irradiating the beam to electrify the sample surface.

Further, the image processing device 19 has a function of calculating characteristic amounts from an obtained image such as a dimension of a pattern on a sample, and the like. Computation for calculating the characteristic amounts can be also performed for a plurality of images obtained from a plurality of the electronic detectors as a target. A control PC 20 is a controller for controlling the whole operation of an electron beam measurement device, and comprehensively controls image processing and signal processing. Further, functions which will be described later, such as a function of converting a dimension value, a function of calculating a pattern angle, and a calculation program function of determining a parameter which is necessary for the conversion and the calculation from measurement data are incorporated in the control PC 20. Additionally, a display device 21 is connected to the control PC 20 and has a function of displaying an image, a calculation result, and a measurement result.

The deflector 5 is a deflector for a beam tilt having at least one-stage deflector. In the case of performing one-stage deflection, the deflector 5 is disposed at an object point position of the objective lens 8. The beam is irradiated from a direction tilted to the ideal optical axis by swing-back action of the objective lens 8. Further, in the case of using a two-stage deflector, the electron beam is separated from the ideal optical axis by an upper stage deflector, and the electron beam is deflected to become a desired tilt angle by a lower stage deflector. FIG. 1 illustrates a deflector for a tilt beam having the two-stage deflector. Alternatively, the deflector therefor may be provided with a multi-stage deflector according to the purpose and required accuracy. Further, the tilt beam may be irradiated on the sample by tilting the XY stage. In the example, proposed herein is a method for electron-optically tilting an angle in which the angle is changed and set at a high speed, however, the effect is the same as the method for tilting the XY stage.

An incident angle of the electron beam can be corrected with respect to the XY stage or the sample. For example, a pyramid-shaped pattern is provided as the standard sample 12, and the electron beam is deflected by the deflector 5 in order for four surfaces of the pyramid appearing in the image to have the same shape, such that an electron beam trajectory can coincide with the ideal optical axis. Additionally, the electron beam trajectory can be adjusted to become a desired tilt angle based on the geometric computation of each surface of the pyramid. A deflection condition (control value) of the deflector 5 is determined based on the aforementioned computation.

The trajectory of the beam is corrected in order for the electron beam to become an accurate tilt angle for each of a plurality of angles, and a controlled value of the deflector 5 is stored at that time, such that it is possible to appropriately perform beam irradiation at a plurality of irradiation angles which will be described later. Measurement using the tilt beam can be automatically executed by performing the beam irradiation under the deflection condition corrected in advance. In the example, a relative angle between the sample and the electron beam is defined as a beam incident angle. Alternatively, a relative angle between the ideal optical axis and the electron beam may be defined as the beam incident angle. In a normal electron beam measurement device (SEM), basically, the electron beam trajectory is perpendicularly set to a moving trajectory of the XY stage (X direction and Y direction). A Z-direction is defined as 0°, and the tilt angles in both the X-direction and the Y-direction are represented by plus and minus numbers. The angles in all directions can be set by combining X and Y.

Next, an outline of a pattern measurement method using a waveform signal (profile waveform) obtained by beam scanning will be described with reference to FIG. 2. FIG. 2(*a*) is a cross-sectional view illustrating a groove-shaped pattern. A dimension of a lower part is formed to be smaller than an upper part of a groove, and a side wall has a relative angle of 0.1° to 0.2° with respect to a perpendicular line (Z-axis) of a sample. FIG. 2(*b*) is a diagram illustrating one example of an image obtained based on the beam scanning with respect to a pattern illustrated in FIG. 2(*a*). In the image illustrated in FIG. 2(*b*), a groove-shaped pattern having the Y direction as a longitudinal direction is illustrated. In the case of performing the beam scanning, two-dimensional scanning is performed in such a manner that the scanning is executed in a line shape in the X direction and a scanning position is moved in the Y direction. A center part of the image corresponds to a groove bottom and usually looks darker than an upper part. FIG. 2(c) illustrates a signal intensity waveform of one line at a position of A-A'. Here, for the descriptions, noise is removed. Generally, a part having a high waveform corresponds to an upper part of a shape, and a part having a low waveform corresponds to a bottom part. In comparison with electrons emitted from the sample surface, the number of electrons emitted from the groove bottom is relatively small due to the electrons colliding with the side walls, and as a result, luminance of the groove bottom becomes lowered in comparison with that of the sample surface.

In the example, a pattern dimension is measured based on a threshold value setting. Management of a semiconductor device manufacturing process is performed by outputting a distance between intersection points of a threshold value and a signal waveform as the dimension value of the pattern. For example, when a threshold value 1 is set, a difference between x-coordinates of intersection points a1 and a2 can be calculated as a dimension A. When a threshold value 2 is set, a difference between coordinates of intersection points b1 and b2 can be calculated as a dimension B. Here, the threshold value a is set as 90% of a total height of the signal waveform and the threshold value b is set as 10% of the total height of the signal waveform. It is desirable that the threshold value 1 is set at a high position within a range in which the threshold value 1 is not buried in noise of a signal, and the threshold value 2 is set at a low position within a range in which the threshold value 2 is not buried in the noise of the signal, thereby making it possible to accurately measure the dimension of the groove bottom.

Here, the dimension A is defined as the dimension of the upper part of the pattern and the dimension B is defined as the dimension of the bottom part of the pattern. Further, a plurality of signal profiles of FIG. 2(c) are acquired at positions in different Y directions, and the plurality of signal waveforms are added and averaged, thereby improving a signal noise ratio, and thus consequently, measurement accuracy can be improved. FIG. 2(d) illustrates an example of an image of another acceleration voltage and detector. A shape of a signal waveform at a pattern bottom part is different. In this case, the threshold value 2 can be set as 0% of a total wave height.

FIG. 3(a) is a diagram illustrating an example in which the groove-shaped pattern is tilted in comparison with FIG. 2(a). In this example, a right-side wall is close to a vertical line in comparison with a left-side groove side wall. An average value of tilts of the side walls on opposite sides is defined as a tilt of the pattern. For example, when a left-side side wall is tilted to a left side by 0.3° (−0.3°) with respect to the vertical line, and the right-side side wall is tilted to a right side by 0.1° (0.1°) with respect to the vertical line, the tilt of the pattern becomes 0.1° (−0.1°) to the left side. FIG. 3(b) is a diagram illustrating an SEM image of the groove-shaped pattern illustrated in FIG. 3(a). In the image illustrated in FIG. 3(b), it can be seen that a bottom part is moved to a right side, and the pattern is tilted. FIG. 3(c) illustrates a signal intensity waveform of the line B-B' of FIG. 3(b). The signal waveform is also asymmetric. When the same threshold values are set (10% and 90% of the total height) as those of FIG. 2, even though actual pattern dimensions of the pattern illustrated in FIG. 2 and the pattern illustrated in FIG. 3 are the same each other, a dimension between intersection points b1 and b2 of FIG. 3 is smaller in comparison with that of FIG. 2. Even though the pattern of FIG. 2(a) and the pattern of FIG. 3(a) have the same shape of the bottom part, a measurement error occurs when the pattern tilt exists. That is, a measurement value is changed not by a pattern part which is an object to be measured but by another factor (vertical deviation of the pattern).

FIG. 3(d) is a diagram illustrating an example of calculating a3 and b3 by finding (a1+a2)/2 and (b1+b2)/2. A center position of the intersection points a1 and a2 is set as a3 and a center position of the intersection points b1 and b2 is set as b3. Here, when a difference between coordinates of a3 and b3 is defined as the vertical deviation, the deviation amount is an index value indicating the tilt angle of the pattern.

Figure 4A:
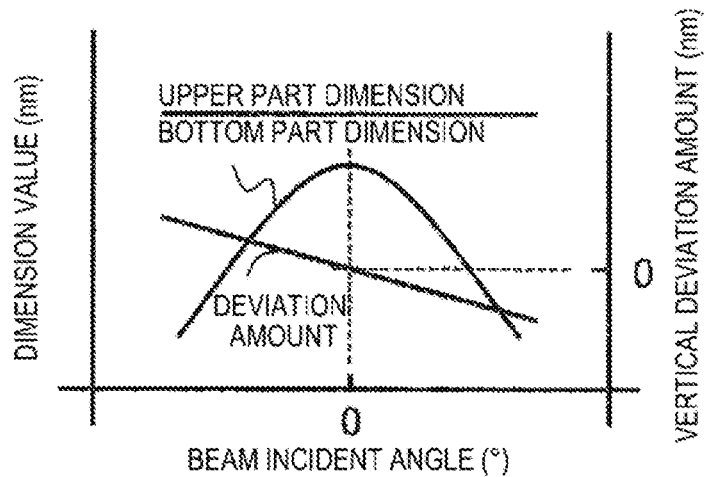
FIGS. 4A to 4C are diagrams illustrating relationship between an upper part dimension value, a bottom part dimension value, and a vertical deviation amount.

In the example, one incident angle of the beam is set and then an image is formed by scanning the beam at the aforementioned angle. Next, a process, in which the image is formed again by changing the incident angle, is repeated a plurality of times, after which an upper part dimension, a bottom part dimension, and a vertical deviation amount are measured in each of the plurality of obtained images. FIG. 4(a) is a diagram illustrating an example of a graph in which the upper part dimension, the bottom part dimension, and the vertical deviation amount are measured at each of the plurality of incident angles and respective values are plotted. In the example, the dimension value and the deviation amount are acquired when the incident angle of the beam is changed from −0.5° to +0.5° by adjusting 0.05° each time. The upper part dimension tends to maintain a fixed value regardless of the change in the beam incident angle, whereas the bottom part dimension tends to decrease as the tilt angle increases. Further, the vertical deviation amount and the incident angle become a proportional relationship.

FIG. 4(a) illustrates a result obtained by the beam scanning on the pattern which does not have the vertical deviation as illustrated in FIG. 2. In this case, when the beam incident angle is zero, the vertical deviation is also zero. In other words, when an incident direction of the beam coincides with a direction of a connection line that connects a center of an upper-side pattern and a center of a lower-side pattern, the vertical deviation becomes zero. Further, when the beam incident angle coincides with a relative angle between the connection line and a Z-axis, the dimension of the bottom part becomes maximum. That is, the beam incident angle at which the vertical deviation amount becomes zero indicates the tilt of the pattern, and the bottom part dimension indicates the maximum value at an angle at which the vertical deviation becomes zero.

Figure 4B:
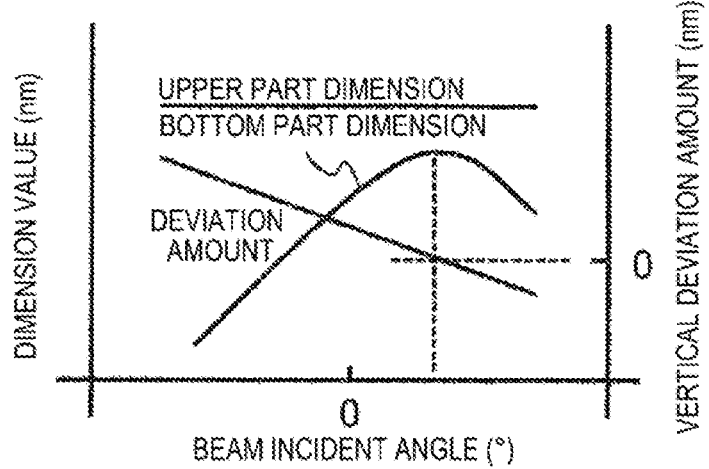

FIG. 4(b) is a diagram illustrating a graph in which an upper part dimension, a bottom part dimension, and a vertical deviation amount are measured by electron beam scanning on the tilted pattern as illustrated in FIG. 3, and then results thereof are plotted. In the same manner as those of FIG. 4(a), the bottom part dimension changes according to a change of a beam irradiation angle, and the vertical deviation and the beam incident angle have a proportional relationship. Meanwhile, a different point is that a point where the bottom part dimension achieves the maximum value is moved from the beam incident angle of 0°, and a position where the vertical deviation amount becomes zero is also moved in the same manner.

The above-mentioned measurement results show that the vertical deviation amount is zero and the bottom part dimension becomes maximum when the beam incident angle is an angle at which the tilt angle of the pattern and the beam incident angle become parallel to each other.

Figure 4C:
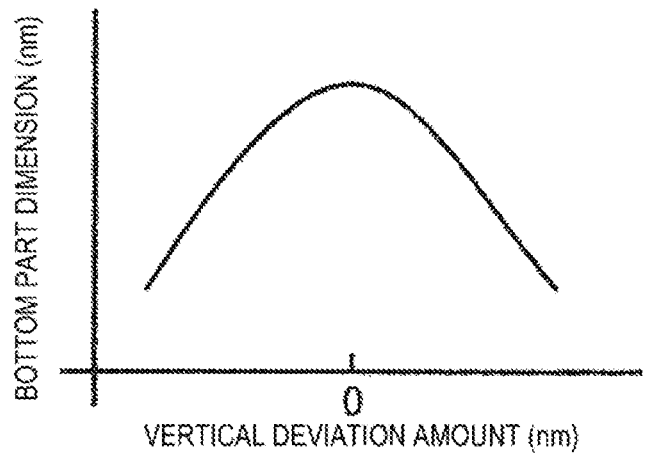

FIG. 4(c) is a diagram illustrating one example of a graph in which the relationship between the vertical deviation and the bottom part dimension is converted and plotted based on the above-mentioned tendency. When measurement is performed using a plurality of the patterns and then each measurement is converted as described above, an approximately one curve can show that the bottom part dimension becomes maximum at a point where the vertical deviation amount becomes 0 without depending on the tilt angle of the pattern.

According to what is described above, when the pattern to be measured is measured at a plurality of the incident angles in advance, and it is known to be put on a curve regardless of the respective pattern tilt angles, it is shown that computation, in which a correction value is added to the bottom part dimension from the vertical deviation amount, can be performed even at one type of the beam incident angle (for example, 0°).

FIG. 5 is a diagram illustrating an example in which the bottom part dimension of the pattern and the vertical deviation amount according to a plurality of incident angles are obtained based on the beam irradiation at a plurality of incident angles with respect to a plurality of groove-shaped patterns, after which a change in the vertical deviation amount and a change in the bottom part dimension are functionalized based on the plurality of the measurement results. FIG. 5(a) illustrates a case in which a graph linearly decreases at both sides of the maximum value; FIG. 5(b) illustrates a case in which a graph decreases in a curve; and FIG. 5(c) illustrates a case in which there exists a flat area having little incident angle dependency in a vicinity of the maximum value. Tilt a shown in FIG. 5(a) is obtained by measuring a plurality of the same types of patterns in advance.

First, a vertical deviation amount D and a bottom part dimension B are measured using a detection signal obtained by irradiating a beam having a beam incident angle of 0° on a certain pattern. An original bottom part dimension B' regardless of the vertical deviation of the pattern is obtained using the measurement results and an equation 1.

$$B' = a \times D + B \quad \text{(Equation 1)}$$

a is a coefficient indicating the change in the bottom part dimension with respect to the change in the vertical deviation amount, the coefficient is obtained in advance, and the original bottom part dimension is calculated by performing measurement of an actual bottom part dimension and the vertical deviation amount. Further, a symbol of the coefficient a is required to be changed according to a deviation direction.

Figure 5A:
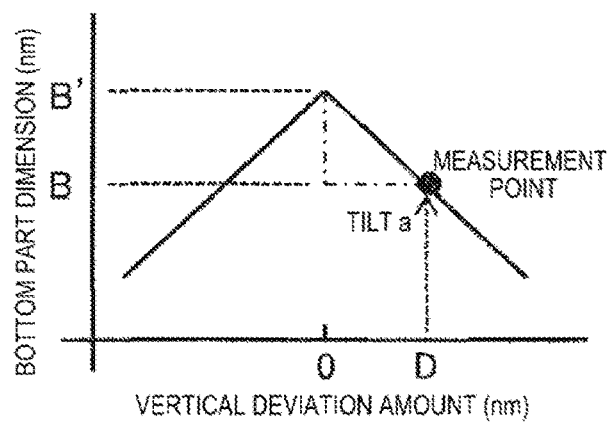
FIGS. 5A to 5D are diagrams illustrating a relationship between a bottom part dimension and a vertical deviation amount.
Figure 5B:
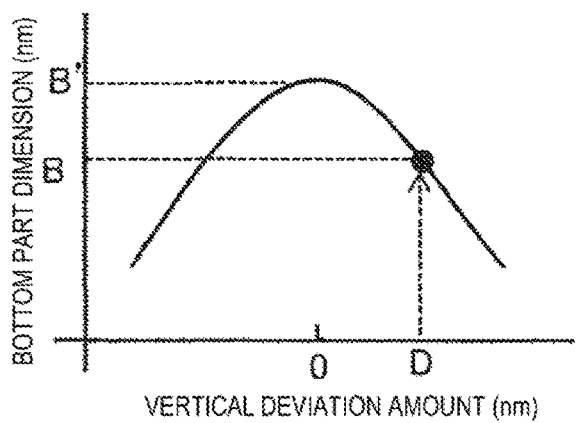

FIG. 5(b) is a graph illustrating a relationship between the bottom part dimension and the vertical deviation amount when the bottom part dimension changes in a quadratic function according to the change of the vertical deviation amount. Since a curve can be approximated by a quadratic function, an equation 2 can be represented as below. Here, a, b, and c are constants obtained in advance.

$$B' = a \times D^2 + b \times D + c + B \quad \text{(Equation 2)}$$

Figure 5C:
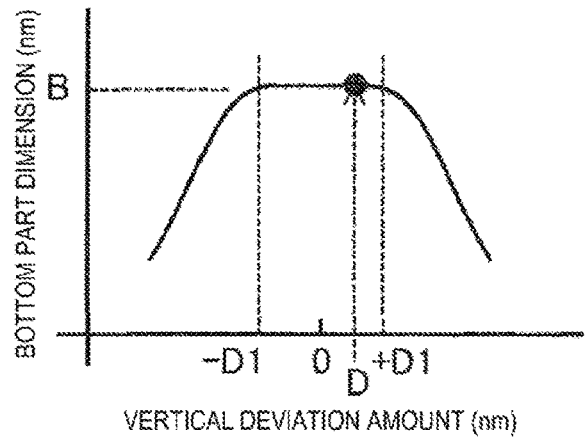
Figure 5D:
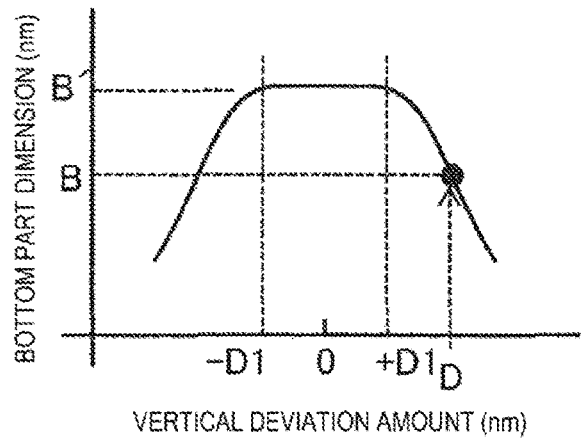

Further, FIGS. 5(c) and 5(d) are graphs illustrating a relationship between the bottom part dimension and the vertical deviation in a case where a fluctuation of the vertical deviation does not exert a significant influence on a measurement value of the bottom part dimension in a range where the vertical deviation is small, whereas the fluctuation of the vertical deviation exerts a large influence on the measurement value of the bottom part dimension in a range where the vertical deviation is large. When a measurement value of the vertical deviation is within a predetermined range (−D1 to +D1), as shown in FIG. 5(c), the measurement value is outputted as a case in which the measurement value is the same as an original dimensional value (Equation 3). Further, when the measurement value of the vertical deviation is out of the predetermined range, as shown in FIG. 5(d), the measurement value is outputted using an equation 4 as a case in which a fluctuation of the measurement value according to the vertical deviation occurs. An accurate bottom part dimension can be obtained by previously storing computation equations as shown in the equations 3 and 4 in a predetermined storage medium.

$$B' = B \text{ (in the case of } -D1 < D < D1) \quad \text{(Equation 3)}$$

$$B' = a \times D + B \text{ (in the case of } -D1 > D \text{ or } D > D1) \quad \text{(Equation 4)}$$

Here, a is a constant obtained in advance. In the case of correction computation thereof, computation may be performed by a computation device for every measurement, or table conversion of hardware may be used in the image processing device. Additionally, computation of a plurality of points may be collectively performed at a time when measurement of one sample is completed, without performing every measurement. Here, a parameter required for computation of D1 is measured and determined in advance.

Figure 11:
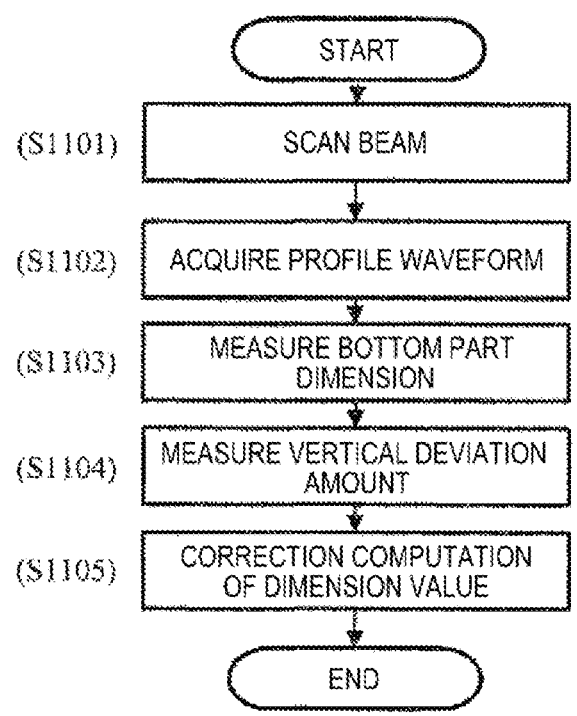
FIG. 11 is a flowchart illustrating a process for obtaining an accurate bottom part dimension based on a bottom part dimension, a vertical deviation amount, and a relationship information between both.

FIG. 11 is a flow chart illustrating a process for measuring a bottom part of a pattern using correction information stored in advance. A wafer where a pattern, which is an object to be measured, is formed is introduced into a vacuum sample chamber of an SEM at step S1101, and a signal that is obtained by scanning the beam on the pattern, which is the object to be measured, is detected, after which a profile waveform is generated at step S1102. In the example, the vertical deviation is acquired as well as the pattern bottom part for accurately measuring the dimension of the pattern bottom part at steps S1103 and S1104. Energy (landing energy) of an electron beam reaching the wafer is modified into two states to measure the vertical deviation amount, and a center of gravity (or center) of the pattern is obtained based on edge information of the pattern obtained in the respective states, such that it is possible to consider a deviation between the centers of gravity as the vertical deviation amount. Further, an upper image is acquired based on the beam scanning for measurement and then the beam scanning is additionally performed for positively charging a sample surface, after which the beam scanning for acquiring an image of a lower part may be performed. The center of gravity can be obtained, for example, by extracting a contour line of an edge based on an SEM image and generating a distance image with the edge as a reference.

Based on the profile waveform, a measurement value of the lower part is acquired, and the vertical deviation amount is also acquired, such that computation of a lower part dimension using the above-mentioned computation equations is performed at step S1105. Further, the example describes an example in which the above-mentioned computation is performed based on the computation equation and the table stored in the control PC 20. Alternatively, the computation may be performed by another computation device.

Further, the example describes an example in which the dimension of the bottom is corrected based on the deviation between the top surface of the pattern and the bottom part thereof, however, the present invention is not limited thereto. For example, dimension values of the bottom part and an intermediate layer may be corrected based on the measurement of a deviation amount between an intermediate part (a desired measurement part between the upper part and the bottom part) of the deep groove and the deep hole and the upper part or the bottom part.

Example 2

In the same manner as correction of the bottom part dimension, the tilt angle of the pattern can be calculated from the vertical deviation amount measured at the beam incident angle of 0°. In FIGS. 4(a) and 4(b), a proportional relationship between the beam incident angle and the deviation amount is required to be obtained in advance, and the tilt angle of the pattern can be calculated from the vertical deviation amount measured at the beam incident angle of 0°. As described above, when a coefficient of the proportional relationship, which is a parameter, is obtained in advance, the angle of the pattern can be calculated by measuring the vertical deviation amount at the beam incident angle of 0° only one time. Normally, when a depth of the pattern is not known, the angle cannot be calculated from the deviation amount, however, since the beam incident angle is corrected by an angle in this method, a numerical value of the angle can be calculated directly from the deviation amount.

Example 3

Figure 6A:
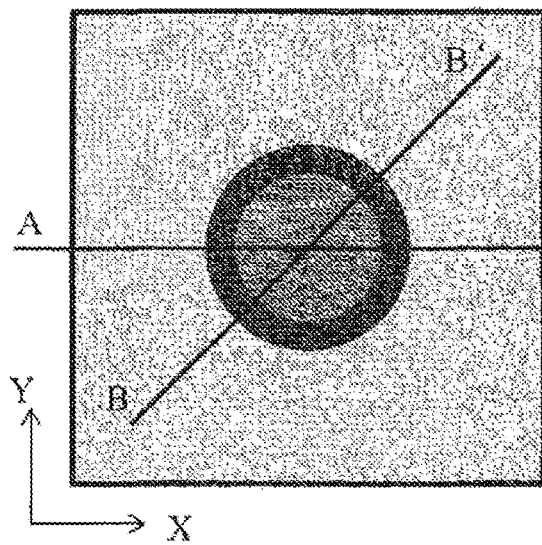
FIGS. 6A to 6D are diagrams illustrating an image and a signal waveform of a deep hole pattern.
Figure 6B:
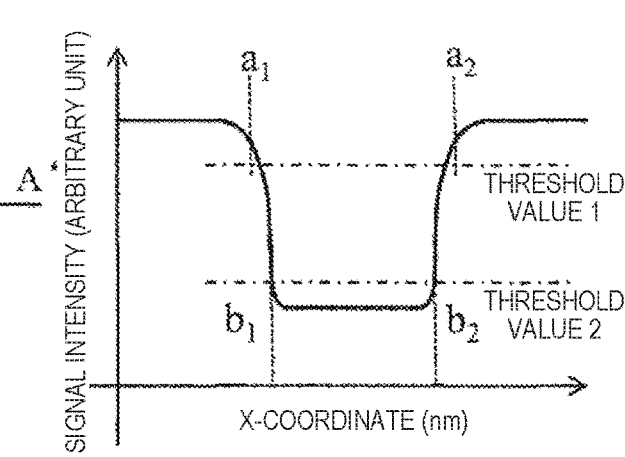

The example describes the groove pattern as an example, however, it can be seen that the hole pattern also has the same signal waveform when a cross section of the hole pattern is selected. FIG. 6(a) illustrates an image of the hole pattern. In the same manner as the groove, the bottom part and the side wall can be observed. The signal waveform of a cross-section A-A' is illustrated in FIG. 6(b). An upper part dimension can be measured by setting a threshold value 1, and a bottom part dimension can be measured by setting a threshold value 2. Further, it is obvious that the same waveform can be obtained even in a cross-section B-B' at another angle (which is an azimuth angle) on the image. However, when the bottom part dimension is measured, the cross-section is required to pass through a virtual center of the hole. The virtual center thereof can be obtained by setting the threshold values on the whole surface of the obtained image and approximating an elliptical shape to the intersection positions, thereby making it possible to determine a center position and measure a hole diameter as a dimension.

Figure 6C:
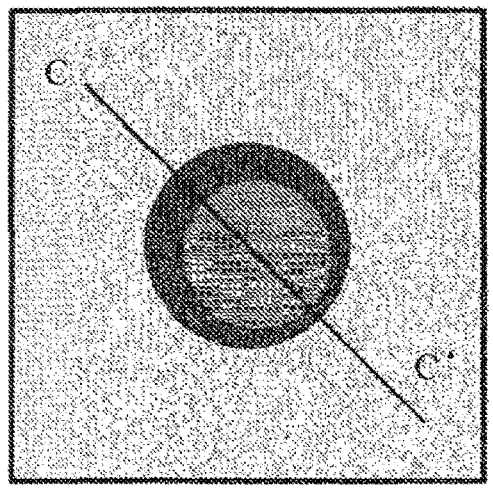
Figure 6D:
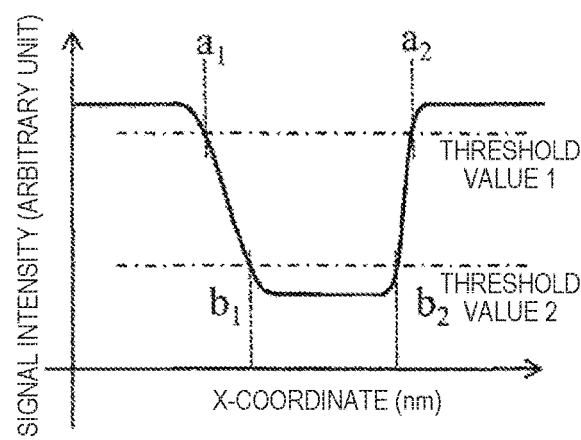

FIG. 6(c) is an image of a pattern of a tilted hole. FIG. 6(d) illustrates a signal waveform when a cross-section C-C' is selected. In this case, as shown in the groove pattern, it can be seen that the pattern has a tilt from asymmetry of a profile. A magnitude of the tilt and an azimuth angle direction of the tilt can be obtained from a difference between a center position of a threshold 1 and a center position of a threshold 2. In the correction of the bottom part dimension, for example, a relationship between the beam incident angle and the bottom part dimension, and the deviation amount of upper and lower center positions may be acquired as a parameter by changing the incident angle of 16 directions dividing the XY directions into four directions at every azimuth angle in advance.

Further, when measuring a dimension of a bottom part of an A-A' direction, and a deviation direction between an upper center and a bottom center is generated in a θ direction with respect to the A-A' direction, for example, the dimension of the bottom part can be obtained by an equation 5 as below:

$$B' = \cos\theta \times a \times D + B \quad \text{(Equation 5)}$$

In this case, it is possible to obtain an accurate bottom part dimension regardless of the deviation direction not only by obtaining the deviation amount between the center of the upper part of the pattern and the center of the bottom part thereof, but also by obtaining the deviation direction using the image processing. For example, a dimensional value correction method according to the deviation direction can be applied to the equations 2, 3, 4, and the like.

Example 4

Figure 7:
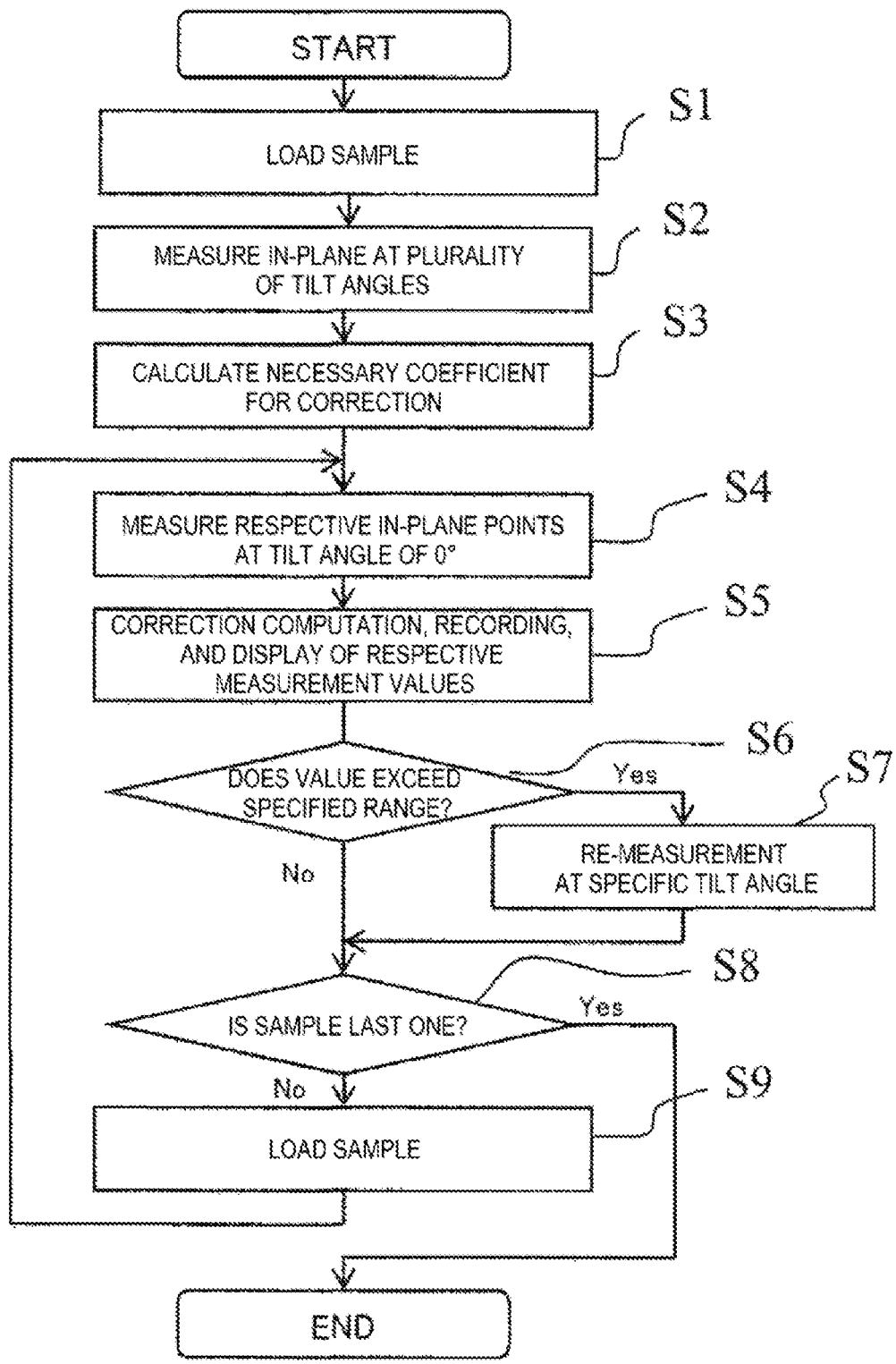
FIG. 7 is a flowchart illustrating a measurement process of a pattern.

The sequence of measurement will be hereinafter described. FIG. 7 illustrates an overall flow of measurement. A representative sample (wafer) is loaded on the XY stage in a device at step S1, and the measurement is performed while changing the beam incident angle at a plurality of positions at step S2. The dimension of the upper part of the pattern, the dimension of the bottom part of the pattern, and beam angle dependency of the difference between each center positions are measured. Further, a correction parameter for correcting the dimension value is calculated at step S3. Next, a predetermined place on the sample is measured at the beam incident angle of 0° (vertical incidence with respect to the sample) at step S4. At step S5, the angle and the dimension value of the pattern are computed by the correction parameter, which is determined at step S3. Here, it is determined whether the calculated value (for example, a vertical deviation, or a relative angle between a line segment connecting center points of the upper part of the pattern and the bottom part thereof obtained from the deviation and the ideal optical axis) exceeds a specified value designated by a user in advance at step S6. When the calculated value does not exceed a range of the specified value, it is determined whether the sample is the last one at step S8, and when the sample is not the last sample, the next sample is loaded at step S9. Thereafter, the measurement of the next sample starts by returning to the step S4. When the sample is the last one at the step S8, the measurement is terminated.

Example 5

When the calculated value exceeds the specified value designated by the user in advance at step S6, measurement of the place is performed again. At this time, measurement is performed by largely tilting the beam more than the angle that is used for calculating the correction parameter in a direction where the angle exceeds the specified value at step S7. Alternatively, when the calculated value exceeds the specified value designated by the user, proposed is another method for not performing the measurement again, and storing the attribute that the place on the sample exceeds a fixed value, and proceeding to the next step.

Example 6

Figure 8:
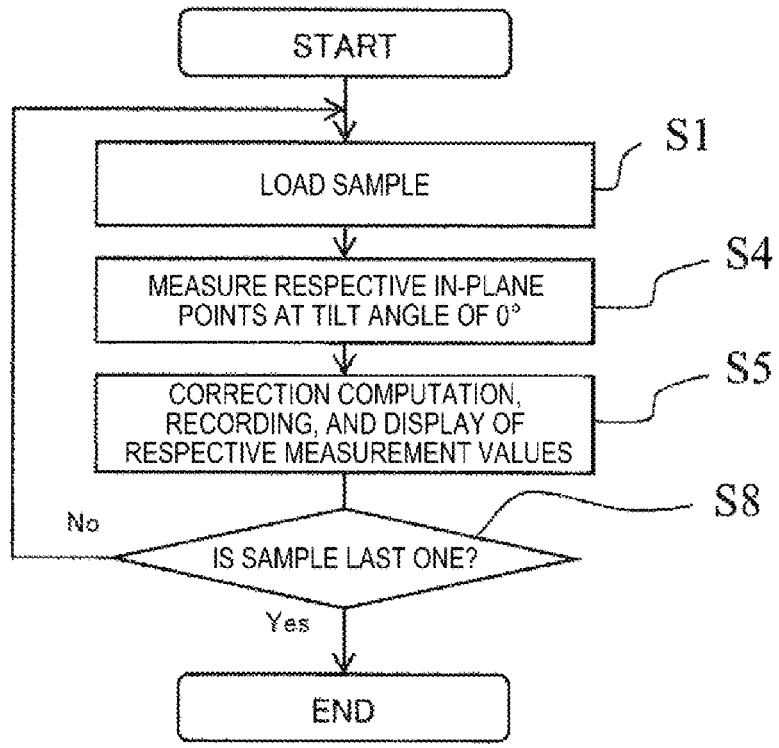
FIG. 8 is a flowchart illustrating a measurement process of a pattern.

When a process for calculating the correction parameter is performed once, the correction parameter can be applied to a sample having the same manufacturing process. When the steps S1 to S3 shown in FIG. 7 are performed once, the sample may be replaced and repeated from steps S4 to S9. At this time, the beam incident angle maintains a normal condition of 0°, such that a time is not required to change, and thus deterioration of throughput also does not occur. The flow at this time is illustrated in FIG. 8. The contents in connection with the steps are the same as the step codes used in FIG. 7. In manufacturing a semiconductor for massproduction, since a large quantity of wafers having the same type and process are often processed, this method is effective.

Example 7

Figure 9:
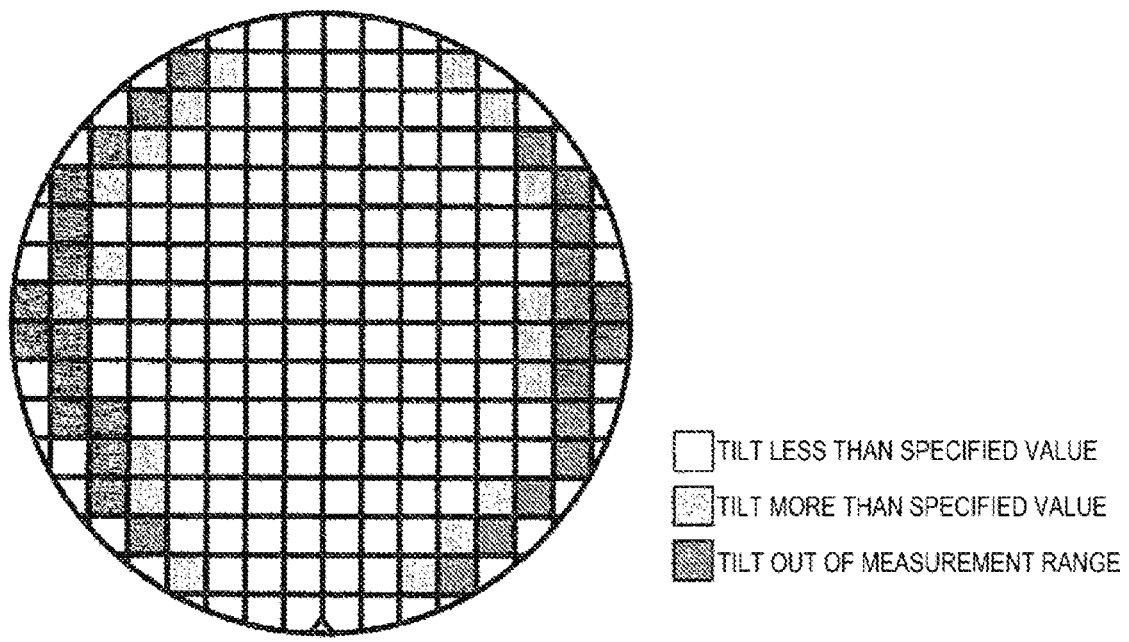
FIG. 9 is a diagram illustrating an in-plane distribution of a measurement value.

Computation results of the obtained bottom part dimension and angle usually display numeric values in a list form, however, it is effective to perform a display in which the computation results are displayed in accordance with pattern positions on the sample (map display) so as to show the tendency in a visually easy manner. FIG. 9 illustrates an example in which an in-plane distribution on the wafer, which is the sample, is displayed. When the value is smaller or larger than the specified value designated in advance according to a place in the wafer, or when the measurement cannot be performed outside a range of the beam incident angle, it is effective to perform the display using a color or a symbol. Further, there exists a method of a vector display showing the direction and magnitude of the tilt angle. The method can be applied not only to perform adjustment (tuning) by giving feedback of what is described above to a process device such as a machining device, but also to determine abnormality of a device, for example, a maintenance period of an etching device, and the like, such that the method can be applied to improve production management and a yield rate of a good-quality product (yield).

Example 8

Figure 10A:
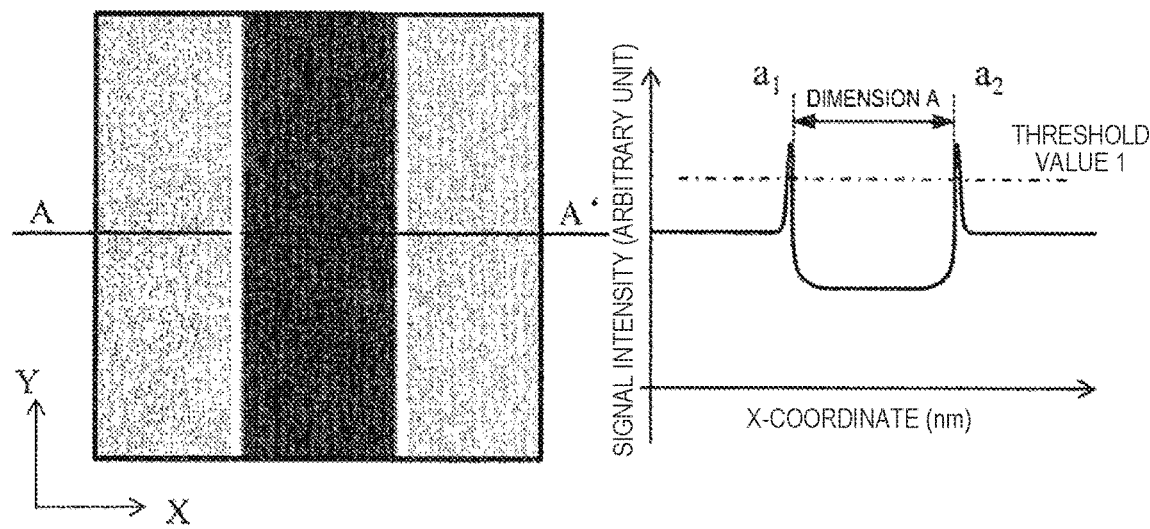
FIGS. 10A and 10B are diagrams illustrating an image and a signal waveform which are generated based on a detection signal detected by a different detector.
Figure 10B:
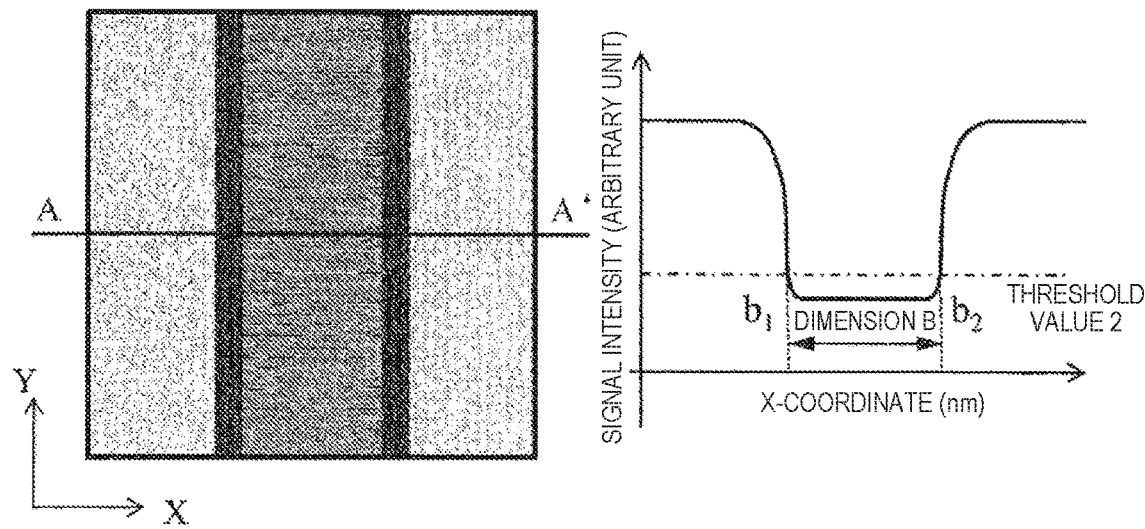

In the example, an image by one detector is used. Alternatively, one detector for forming an image for measuring the upper part dimension and the other detector for forming an image for measuring the lower dimension may be separately used. In the pattern measurement device provided with the scanning electron microscope and the like, the secondary electron and the backscattered electron are roughly classified as types of electrons to be detected. While the secondary electron has low emission energy, the secondary electron has characteristics in that an occurrence rate is high and the amount of information of a substance surface is large. Further, when the electron beam has arrival energy of about 30 kV, the backscattered electrons reflected at the bottoms of the deep hole and the deep groove rush into the side walls of the deep groove and the deep hole, thereby having energy capable of escaping from the sample surface. Since a trajectory of such backscattered electron has a large relative angle with respect to the ideal optical axis of the electronic beam, the detector 10 disposed under the objective lens 8 (disposed at a sample side than a side of the detector 9) can efficiently detect the electrons emitted from the groove bottom and the hole bottom. For example, FIG. 10(a) illustrates a secondary electron image and a signal waveform obtained by the detector 9 shown in FIG. 1. Additionally, FIG. 10(b) illustrates a backscattered electron image and a signal waveform obtained by the detector 10 shown in FIG. 1. The upper part dimension is defined as a dimension A of FIG. 10(a) and the lower dimension is defined as a dimension B of FIG. 10(b), and the vertical deviation amount can be calculated from the coordinate values of two center positions of the respective dimension A and dimension B. When FIGS. 10(a) and 10(b) are synchronized and simultaneously acquired on the device, pixels constituting the image represent the same place. Further, in the same manner as the case in which one image is used, the bottom part dimension and the vertical deviation amount, and angle measurement of the pattern from these and correction of the bottom part dimension can be performed.

REFERENCE SIGNS LIST

1: column
2: sample chamber
3: electron gun
4: condenser lens
5: beam aligner
6: E×B deflector
7: deflector
8: objective lens
9: electronic detector
10: electronic detector
11: wafer
12: standard sample
13: XY stage
14: optical microscope
15, 16: amplifier
17: electron beam scanning controller
18: stage controller
19: image processing device
20: control PC
21: display device

The invention claimed is:

1. A pattern measurement device comprising a computation device for measuring a dimension of a pattern formed on a sample based on a signal obtained by a charged particle beam device, wherein
the computation device obtains a deviation between a first part of the pattern and a second part of the pattern having a different height from the first part and a dimension value of the pattern from a detection signal obtained based on scanning of a charged particle beam on the sample, and corrects the dimension value of the pattern using the deviation obtained from the detection signal and relationship information indicating a relationship between the dimension of the pattern and the deviation.

2. The pattern measurement device according to claim 1, wherein
the computation device adds a correction value according to the deviation between the first part and the second part to the dimension value of the pattern obtained from the detection signal.

3. The pattern measurement device according to claim 1, wherein
the dimension value of the pattern is a dimension value of a bottom part of the pattern.

4. A pattern measurement device comprising a detector that detects a charged particle obtained based on irradiation of a charged particle beam emitted from a charged particle source on a sample; and a controller that measures a dimension of a pattern formed on the sample based on an output of the detector, wherein
the controller obtains a deviation between a first part of the pattern and a second part of the pattern having a different height from the first part and a dimension value of the pattern from a detection signal obtained based on scanning of the charged particle beam on the sample, and corrects the dimension value of the pattern using the deviation obtained from the detection signal and relationship information indicating a relationship between the dimension of the pattern and the deviation.

5. The pattern measurement device according to claim 4, further comprising:

a tilt beam irradiation mechanism including at least one of a tilt deflector that deflects the charged particle beam for irradiating the charged particle beam on the sample from a direction tilted to an ideal optical axis of the charged particle beam, and a tilt stage for tilting the sample, wherein the controller controls at least one of the tilt deflector and the tilt stage, measures the dimension value of the pattern at a plurality of tilt angles, and generates the relationship information based on the dimension value of the pattern at the plurality of tilt angles.

6. The pattern measurement device according to claim 4, further comprising:

a tilt beam irradiation mechanism including at least one of a tilt deflector that deflects the charged particle beam for irradiating the charged particle beam on the sample from a direction tilted to an ideal optical axis of the charged particle beam and a tilt stage for tilting the sample, wherein the controller calculates a tilt angle of the pattern form the deviation and a tilt angle of the charged particle beam.

7. The pattern measurement device according to claim 4, wherein the detector includes a first detector and a second detector that is disposed at a side of the sample rather than at a side of the first detector; and the controller obtains the deviation between the first part and the second part based on outputs of the first detector and the second detector.

8. The pattern measurement device according to claim 4, wherein the controller determines whether a value obtained based on the detection signal exceeds a specified value.

9. A pattern measurement method for measuring a dimension of a pattern formed on a sample based on a signal obtained from a charged particle beam device, the method comprising:

obtaining a deviation between a first part of the pattern and a second part of the pattern having a different height from the first part and a dimension value of the pattern from a detection signal obtained based on scanning of a charged particle beam on the sample; and correcting the dimension value of the pattern using the deviation obtained from the detection signal and relationship information indicating a relationship between the dimension of the pattern and the deviation.

10. The pattern measurement method according to claim 9, further comprising:

generating the relationship information based on detection signals obtained by irradiating charged particle beams having a plurality of different tilt angles on the sample.

11. The pattern measurement method according to claim 9, further comprising:

determining whether a value obtained based on the detection signal exceeds a specified value.

* * * * *